United States Patent
Ruby (10) Patent No.: US 8,422,300 B2
(45) Date of Patent: *Apr. 16, 2013

(54) NON-VOLATILE MEMORY APPARATUS AND METHODS

(75) Inventor: Paul D. Ruby, Folsom, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/219,473

(22) Filed: Aug. 26, 2011

(65) Prior Publication Data

US 2011/0310664 A1 Dec. 22, 2011

Related U.S. Application Data

(63) Continuation of application No. 12/573,606, filed on Oct. 5, 2009, now Pat. No. 8,009,478.

(51) Int. Cl.
*G11C 16/00* (2006.01)
(52) U.S. Cl.
USPC ............ 365/185.18; 365/185.05; 365/185.17
(58) Field of Classification Search .............. 365/185.02
See application file for complete search history.

(56) References Cited

U.S. PATENT DOCUMENTS

| | | | | |
|---|---|---|---|---|
| 4,939,690 A | * | 7/1990 | Momodomi et al. | 365/185.17 |
| 6,058,045 A | * | 5/2000 | Pourkeramati | 365/185.17 |
| 6,058,046 A | * | 5/2000 | Imamiya et al. | 365/185.3 |
| 7,009,881 B2 | * | 3/2006 | Noguchi | 365/185.18 |
| 7,035,144 B2 | | 4/2006 | Kim et al. | |
| 7,170,785 B2 | | 1/2007 | Yeh | |
| 7,272,039 B2 | | 9/2007 | Rudeck et al. | |
| 7,272,043 B2 | * | 9/2007 | Liao et al. | 365/185.18 |
| 7,561,469 B2 | | 7/2009 | Aritome | |
| 7,760,550 B2 | * | 7/2010 | Fayrushin et al. | 365/185.18 |
| 8,009,478 B2 | * | 8/2011 | Ruby | 365/185.18 |
| 2008/0056008 A1 | | 3/2008 | Aritome et al. | |
| 2008/0205147 A1 | | 8/2008 | Santin et al. | |
| 2008/0259689 A1 | | 10/2008 | Roohparvar | |
| 2009/0046507 A1 | | 2/2009 | Aritome | |
| 2011/0080787 A1 | | 4/2011 | Ruby | |

FOREIGN PATENT DOCUMENTS

WO WO-2005078733 8/2005

* cited by examiner

*Primary Examiner* — Tan T. Nguyen
(74) *Attorney, Agent, or Firm* — Schwegman, Lundberg & Woessner, P.A.

(57) ABSTRACT

Some embodiments include apparatus and methods having memory cells coupled in series and a module to cause an application of voltages with at least three different values to gates of the memory cells during an operation to retrieve information stored in at least one of the memory cells. Additional apparatus and methods are described.

18 Claims, 7 Drawing Sheets

NON-VOLATILE MEMORY APPARATUS AND METHODS

PRIORITY APPLICATION

This application is a continuation of U.S. application Ser. No. 12/573,606, filed Oct. 5, 2009 now U.S. Pat. No. 8,009,478, which is incorporated herein by reference in its entirety.

BACKGROUND

Non-volatile memory devices, such as flash memory devices, are used in many computers and other electronic products to store information. A flash memory device stores information in numerous memory cells, which are usually formed in a semiconductor chip. Each of the memory cells often has a metal-oxide semiconductor (MOS) transistor with two different transistor gates: a control gate and a so-called "floating" gate. The control gate is used to turn the transistor on and off to control access to the memory cell. The floating gate is usually a place where information is stored in each memory cell.

A flash memory device usually has a programming operation to store information into the memory cells, a read operation to retrieve information from the memory cells, and an erase operation to clear information from the memory cells. Programming, read, and erase operations usually involve applying voltages to the control gates of the memory cells and to other device components within the flash memory device. A conventional flash memory device often goes through many programming, read, and erase operations during its life.

DETAILED DESCRIPTION

Figure 1:
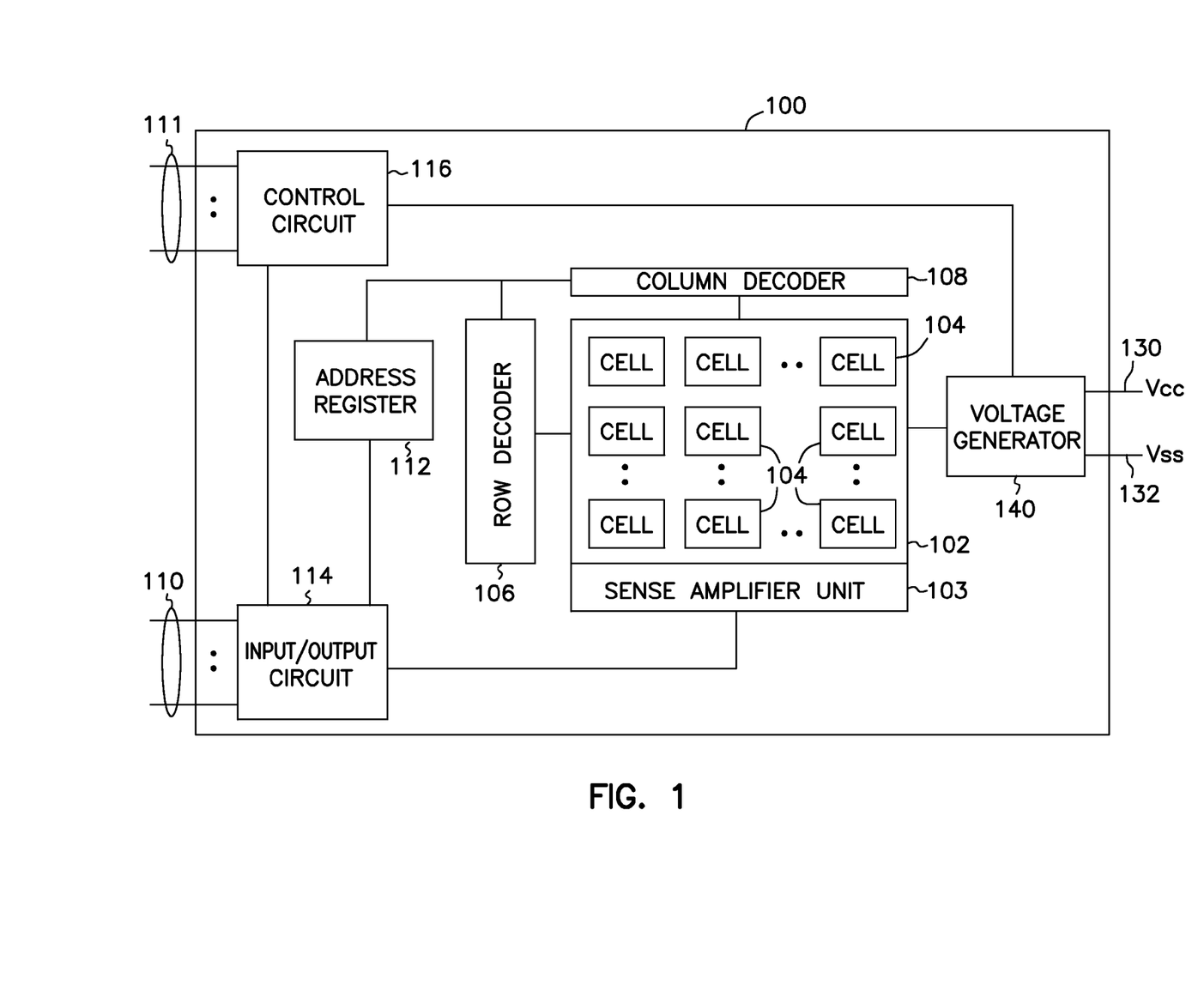
FIG. 1 shows a block diagram of a memory device, according to an example embodiment of the invention.

FIG. 1 shows a block diagram of a memory device 100, according to an example embodiment of the invention. Memory device 100 includes a memory array 102 with memory cells 104 arranged in rows and columns. Row decoder 106 and column decoder 108 respond to an address register 112 and selectively access memory cells 104 based on row address and column address signals on lines 110. A data input/output circuit 114 may transfer information (e.g., data) between memory cells 104 and lines 110. A sense unit, such as sense amplifier unit 103, operates to sense signals associated with selected memory cells during a memory operation to determine information stored in the selected memory cells. A control circuit 116 controls operations of memory device 100 based on signals on lines 110 and 111. Memory device 100 can be a flash memory device; the flash memory device can include a NAND flash memory device where memory cells 104 includes flash memory cells arranged in a NAND flash memory arrangement. One skilled in the art will readily recognize that memory device 100 includes other parts, which are omitted from FIG. 1 to focus on the various embodiments described herein.

Memory device 100 includes lines 130 and 132 to receive voltages Vcc and Vss. Voltage Vcc can be a supply voltage for memory device 100. Voltage Vss can be a reference voltage, such as a ground potential. Memory device 100 also includes a voltage generator 140. Voltage generator 140 and control circuit 116 (or parts thereof) may act separately or together to cause different voltage values to be applied to memory array 102, such as by providing the different voltages to the memory array 102. Accordingly, voltage generator 140 and control circuit 116 (or parts thereof) may be referred to separately or together as a module to cause the application of different voltage values. The operations include a programming operation to store information into memory cells 104, a read operation to retrieve information from memory cells 104, and an erase operation to clear information from all or a portion of memory cells 104. Memory device 100 includes the memory devices and their associated operations described below with reference to FIG. 2 though FIG. 7.

Figure 2:
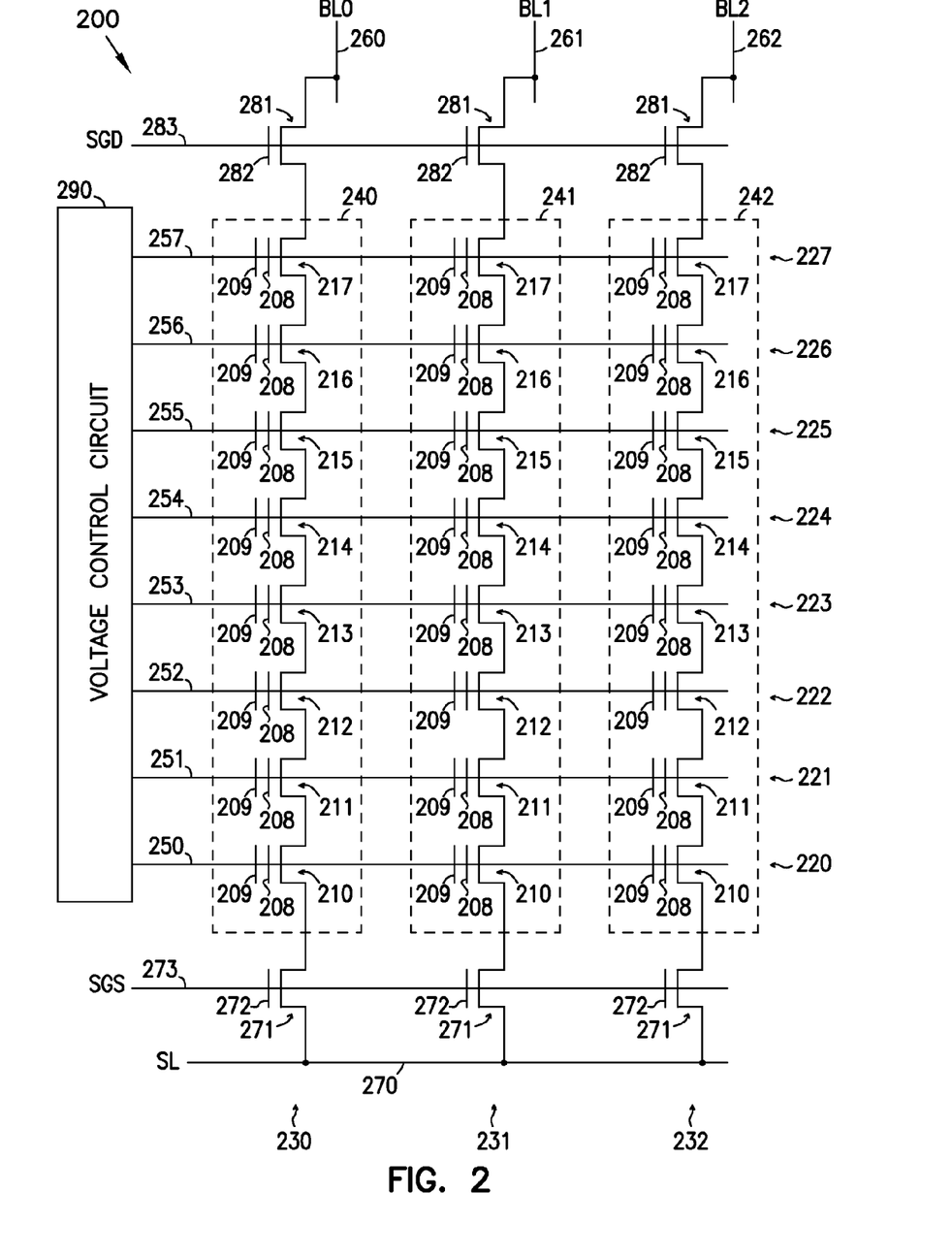
FIG. 2 shows a partial schematic diagram of a memory device, according to an example embodiment of the invention.

FIG. 2 shows a partial schematic diagram of a memory device 200, according to an example embodiment of the invention. Memory device 200 includes a number of memory cells 210, 211, 212, 213, 214, 215, 216, and 217 arranged in rows 220, 221, 222, 223, 224, 225, 226, and 227 and columns 230, 231, and 232. Each of the memory cells includes a floating gate 208 and a control gate 209. The memory cells in the same column are connected in series to form a string of memory cells, such as strings 240, 241, and 242. Memory device 200 includes lines (e.g., access lines, such as word lines) 250, 251, 252, 253, 254, 255, 256, and 257 associated with the rows. Memory device 200 also includes lines (e.g., sense lines, such as bit lines) 260, 261, and 262 associated with the columns. Control gates 209 of memory cells in the same row (row 220 through 227) are coupled to the same line (one of lines 250 through 257) associated with that row. FIG. 2 shows an example of three strings with eight memory cells in each string. The number of strings and the number memory cells in each string may vary.

Memory device 200 includes select transistors 271, each being coupled between one of strings 240, 241, and 242 and a source line 270, which has a signal SL. Each select transistor 271 includes a gate 272 coupled to a select line 273. A select signal SGS on select line 273 can be used to activate (turn on) select transistors 271 to electrically couple strings 240, 241, and 242 to line 270 during a memory operation (e.g., a read operation). Memory device 200 also includes select transistors 281, each being coupled between one of strings 240, 241, and 242 and one of lines 260, 261, and 262; these lines have corresponding signals BL0, BL1, and BL2. Each select transistor 281 includes a gate 282 coupled to a select line 283. A select signal SGD on select line 283 can be used to activate select transistors 281 to electrically couple strings 240, 241, and 242 to lines 260, 261, and 262 during a memory operation (e.g., a read operation).

In memory device 200, to program, read, or erase the memory, appropriate voltages can be applied to a combination of: select lines 273 and 283; lines 250 through lines 257; lines 260, 261, and 262; and source line 270. To focus on the embodiments herein, this description omits the discussion related to programming and erase operations.

As shown in FIG. 2, memory device 200 includes a voltage control circuit 290, which can be a part of a control circuit and voltage generator of memory device 200 that are similar to control circuit 116 and voltage generator 140 of FIG. 1. In FIG. 2, in a read operation, voltage control circuit 290 applies voltages of different values to lines 250 through lines 257 to retrieve information from a selected memory cell in one or more of the strings 240, 241, and 242.

In the description herein, a selected memory cell refers to the memory cell that is selected during that particular read operation so that information can be retrieved from it; unselected memory cells during that particular read operation refer to the memory cells that are not selected to retrieve information from them during that particular read operation.

Figure 3:
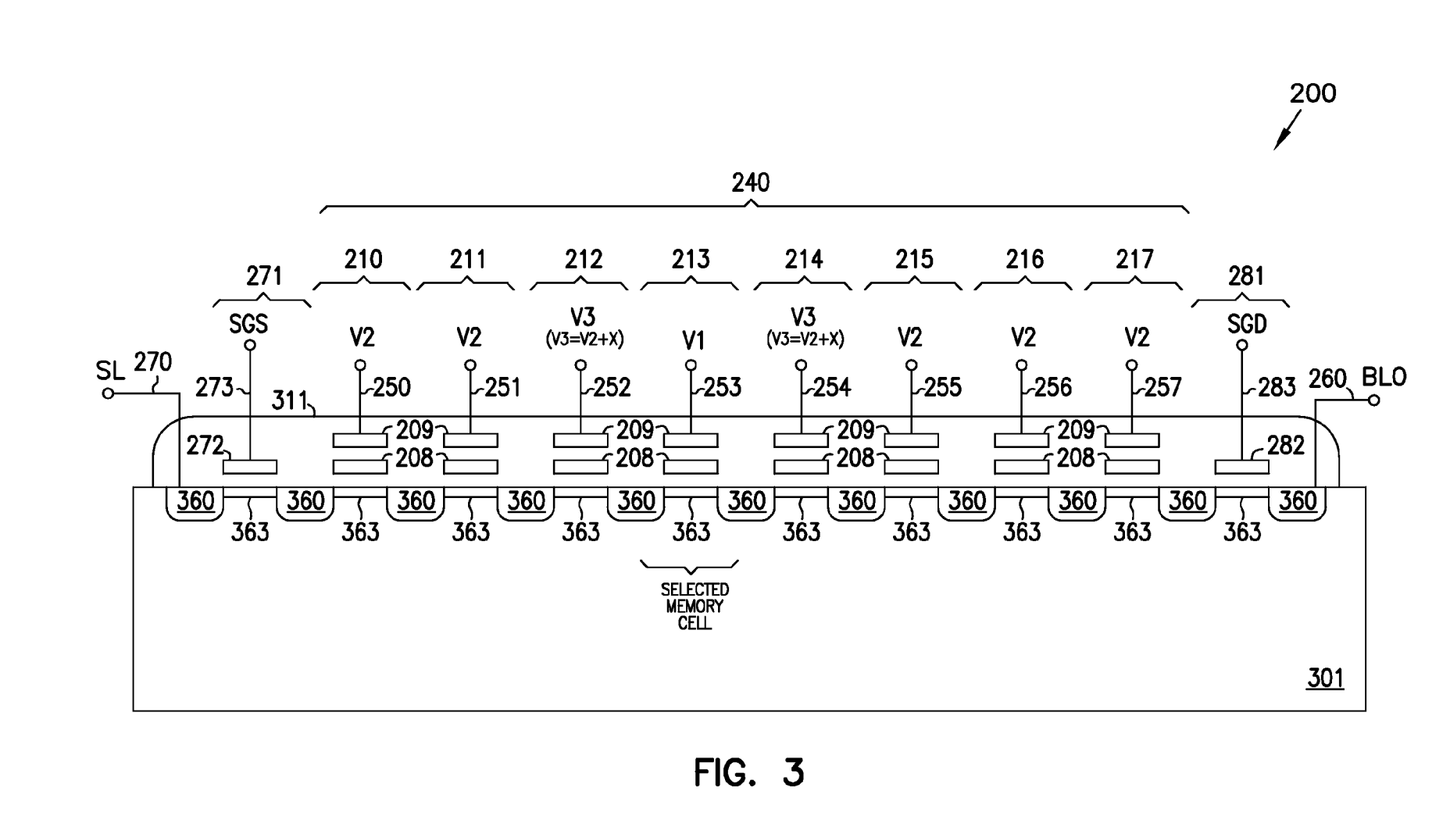
FIG. 3 shows a diagram of a partial cross-section of the memory device of FIG. 2, according to an example embodiment of the invention.

FIG. 3 shows a diagram of a partial cross-section of memory device 200 of FIG. 2. FIG. 3 shows a partial cross-section of string 240 of memory device 200. Other strings (e.g., strings 241 and 242 in FIG. 2) have structures similar or identical to the structure shown in FIG. 3. As shown in FIG. 3, memory device 200 includes a substrate 301. In each memory cell 210 through 217, floating gate 208 and control gate 209 are formed above source/drain regions 360 of substrate 301 and are isolated from each other by an insulating material 311. Each region 360 forms a source region (or drain region) of a transistor or forms a combination of a source/drain region shared by two transistors, as shown in FIG. 3.

The following description of a read operation of memory device 200 assumes memory cell 213 of string 240 is the selected memory cell; other memory cells of string 240 are unselected memory cells.

In a read operation, memory device 200 turns on transistors 271 and 281 to electrically couple string 240 to lines 260 and 270. A sense amplifier unit of memory device 200 (not shown in FIG. 2 and FIG. 3 but similar to sense amplifier unit 103 of FIG. 1) senses the value of signal BL0 on line 260 to determine the value of information in memory cell 213. The value (e.g., current or voltage value) of signal BL0 on line 260 depends on whether a conductive path is formed between lines 260 and 270. The conductive path is formed if the transistors in all memory cells within the string 240 are turned on. A conductive path is not formed if the transistor of the selected memory cell is not turned on.

In the read operation, memory device 200 applies voltages V1, V2, and V3 to gates 209 of memory cells 210 through 217. Voltages V1, V2, and V3 have different values. As shown in FIG. 3, memory device 200 applies voltage V1 to gate 209 of (selected) memory cell 213, voltage V3 to gates 209 of (unselected) memory cells 212 and 214 that are immediately adjacent memory cell 213, and voltage V2 to gates 209 of other unselected memory cells of string 240. Voltages V2 and V3 have sufficient values that turn on transistors of unselected memory cells 210, 211, and 212, regardless of the values of information stored in these unselected memory cells, thereby forming a conductive segment between line 270 and channels 363 and regions 360 of memory cells 210, 211, and 212. Voltages V2 and V3 also have sufficient values that turn on transistors of unselected memory cells 214, 215, 216, and 217, regardless of the values of information stored in these unselected memory cells, thereby forming a conductive segment between line 260 and channels 363 and regions 360 of memory cells 214, 215, 216, and 217. A conductive path between lines 260 and 270 is formed if the transistor of selected memory cell 213 is turned on, thereby forming a conductive segment between channel 363 and regions 360 of memory cell 213

Voltage V1 has a value such that a conductive segment between channel 363 and regions 360 of memory cell 213 is formed if memory cell 213 has a threshold voltage value (e.g., a negative value) less than the value of voltage V1. For example, the threshold voltage value of memory cell 213 is less than the value of voltage V1 when memory cell 213 is not in a programmed state (e.g., when it is erased). The conductive segment between channel 363 and regions 360 of memory cell 213 is not formed if memory cell 213 has a threshold voltage value (e.g., a positive value) greater than the value of voltage V1. For example, in what the industry refers to as a single-level cell, the threshold voltage value of memory cell 213 is greater than the value of voltage V1 when memory cell 213 is in a programmed state (e.g., when it is not erased).

During a read operation, the value of information in memory cell 213 can be determined based on current between lines 260 and 270. For example, current between lines 260 and 270 can be substantially zero if the conductive path between lines 260 and 270 is not formed and can be some positive value if the conductive path between lines 260 and 270 is formed. Based on this current, memory device 200 appropriately provides an output signal to reflect the value of the information stored in memory cell 213. Memory device 200 can provide the output signal to lines similar to lines 110 of FIG. 1.

As mentioned above, voltages V1, V2, and V3 have different values. Voltage V1 can have a value of zero volts. Voltage V3 can be greater than each of voltages V2 and V1. As shown in FIG. 3, V3=V2+X, where X is a positive voltage value. For example, voltage V2 can be approximately 5 volts and X can be approximately 600 milivolts. Other values can be used.

In a memory device, such as memory device 200 of FIG. 3, improper control of the voltages applied to the memory cells during a memory operation (e.g., a read operation) may lead to inferior device performance, reduced device reliability, or both.

In memory device 200, the difference in values between voltages V2 and V3 can improve read operations, as explained in the flowing description. Voltages V2 and V3 applied at gates 209 creates an effective voltage on gates 208 of memory cells 210, 211, 212, 214, 215, 216, and 217 to turn on the transistors of these memory cells to create potential conductive segments between lines 260 and 270, depending on the threshold voltage value memory cell 213, as described above. Since memory cells 212 and 214 are immediately adjacent selected memory cell 213, if the same voltage V2 is applied to gates 209 of all unselected memory cells, then the effective voltage on gates 208 of memory cells 212 and 214 can be lower than the effective voltage on gates 208 of other memory cells (210, 211, 215, 216, and 217) that are farther from selected memory cell 213 than each of memory cells 212 and 214. The reason of a lower effective voltage on gates 208 of memory cells 212 and 214 is that voltage V1 at gate 209 of memory cell 213 has a value less than that of voltage V2 of adjacent memory cells 212 and 214 if voltage V2 is applied to gates 209 of memory cells 212 and 214. The lower effective voltage on gates 208 of memory cells 212 and 214 may not efficiently turn on the transistors of memory cells 212 and 214. Thus, current flowing on the conductive path (if it is formed) between lines 260 and 270 may be affected (e.g. flowing less efficiently). This may make sensing current during the read operation less efficiently.

In memory device 200, since a voltage V3 having a value greater than that of voltage V2 is applied to gates 209 of memory cells 212 and 214, the effective voltage on gates 208 of memory cells 212 and 214 can be increased to compensate for any potential reduction in their values because the difference in values between voltages V3 and V1 is greater than the difference in values between voltages V2 and V1. Thus, a more uniform voltage on gates 208 of unselected memory cells can be obtained, and transistors of memory cells 212 and 214 can be turned on more efficiently. This can improve the read operations in memory device 200.

In some cases, if voltage V2 is applied to gates 209 of all unselected memory cells, then the effective voltage on gate 208 of each of adjacent unselected memory cells 212 and 214 can be approximately ten percent less than the effective voltage on gates 208 of unselected memory cells 210, 211, 215, 216, and 217. Thus, in some cases, selecting voltage V3 with a value of approximately ten percent greater than the value of voltage V2 can compensate a potential reduction in effective voltage on gates 208 of adjacent unselected memory cells 212 and 214. Therefore, in the equation V3=V2+X, the value of X can be selected such that the effective voltage on gates 208 of memory cells 212 and 214 can be approximately equal to the effective voltage on gates 208 of the other unselected memory cells. For example, X can have a value such that the value of V3 is approximately ten percent greater than the value of voltage V2.

Figure 4:
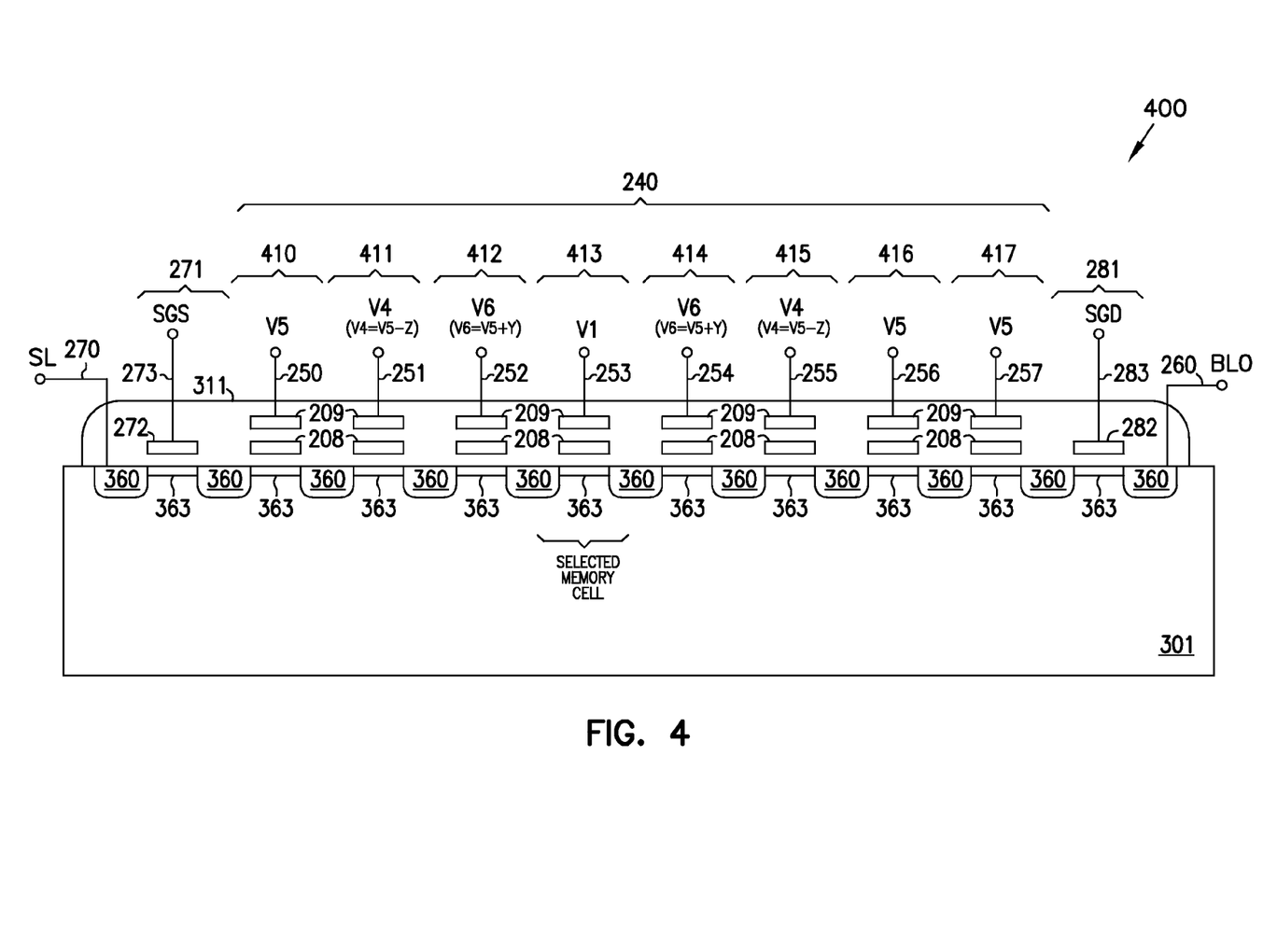
FIG. 4 shows a diagram of a portion of a memory device with voltages applied to gates of memory cells of the memory device during a read operation, according to an example embodiment of the invention.

FIG. 4 shows a diagram of a portion of a memory device 400 with voltages V1, V4, V5, and V6 applied to gates of memory cells 410 through 417 during a read operation, according to an example embodiment of the invention. Memory device 400 includes components similar to those of memory device 200 of FIG. 2 and FIG. 3. Similar components between FIG. 3 and FIG. 4 have the same designation numbers. For simplicity, the description for the similar components between FIG. 3 and FIG. 4 is not repeated.

As shown in FIG. 4, memory cell 413 is assumed to be a selected memory cell during a read operation of memory device 400; other memory cells 410, 411, 412, 414, 415, 416, and 417 are unselected memory cells. The main difference between the voltages V1, V4, V5, and V6 and voltages V1, V2 and V3, of FIG. 3 is that, in FIG. 4, four voltages V1, V4, V5, and V6 have different values applied to gates 409 of memory cells 410 through 417. In FIG. 3, only three voltages V1, V2, and V3 having different values are applied to gates 209 of memory cells 210 through 217.

As shown in FIG. 4, V6=V5+Y and V4=V5−Z, where Y and Z are positive voltage values. Voltage V1 can be zero volts. Voltage V6 can correspond to voltage V3 of FIG. 3, and the value of Y can correspond to the value of X in FIG. 3. The value of Z is less than the value of Y. In equations V6=V5+Y and V4=V5−Z, the values of Y and Z can be selected such that the effective voltage one gates 208 of memory cells 412 and 414 can be approximately equal to the effective voltage on gates 208 of the other unselected memory cells. For example, when voltage V1 is zero volts and voltage V5 is approximately 5 volts, Y can be approximately 600 milivolts, and Z can be approximately 200 milivolts.

In FIG. 4, since the value of voltage V6 is greater than the value of voltage V5, if voltage V5 is also applied to gates 209 of unselected memory cells 411 and 415, then the effective voltage on gates 208 of memory cells 411 and 415 can be different from (e.g., higher than) the effective voltage on gates 208 of other unselected memory cells 210, 216, and 217. Therefore, by applying voltage V4 that is less than voltage V5 to gates 209 of memory cells 411 and 415, the effective voltage on gates 208 of memory cells 411 and 415 can be also substantially equal to the effective voltage on gates 208 of other unselected memory cells, thereby further improving read operations in memory device 400.

Figure 5:
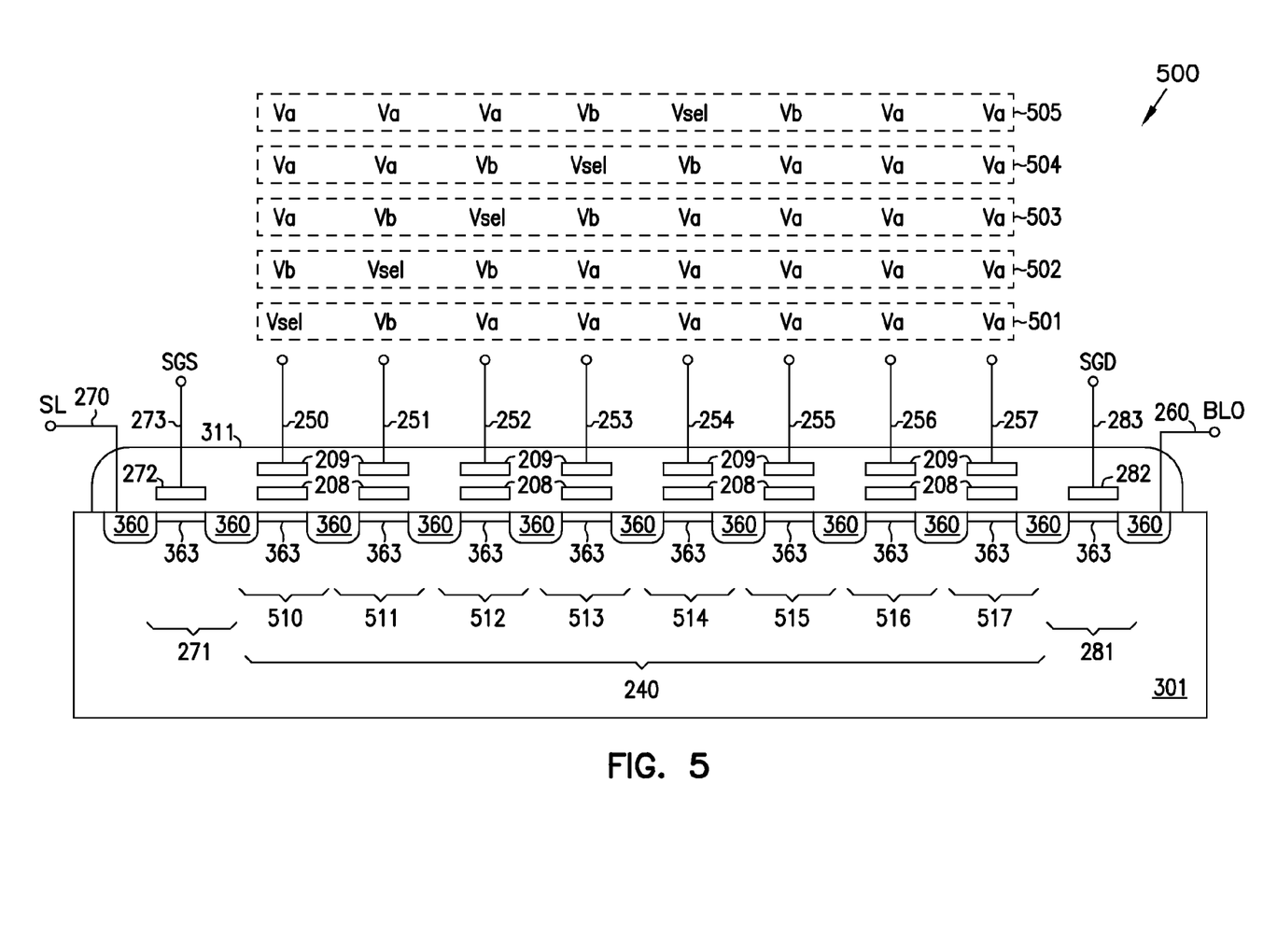
FIG. 5 shows a diagram of a portion of a memory device with three voltages applied to gates of different selected memory cells at different read operations of the memory device, according to an example embodiment of the invention.

FIG. 5 shows a diagram of a portion of a memory device 500 with voltages V1, Va, and Vb applied to gates of different selected memory cells at different read operations 501, 502, 503, 504, and 505, according to an example embodiment of the invention. Voltage Vsel, Va, and Vb can respectively correspond to voltages V1, V2, and V3 of FIG. 3. Memory device 500 includes components similar to those of memory device 200 of FIG. 2 and FIG. 3. Similar components between FIG. 3 and FIG. 5 have the same designation numbers. For simplicity, the description for the similar components between FIG. 3 and FIG. 5 is not repeated.

In FIG. 5, in each of read operations 501, 502, 503, 504, and 505, the selected memory cell is the memory cell having Vsel applied to its gate 209 (e.g., control gate). For example, in read operation 501, the selected memory cell is memory cell 510 having voltage Vsel applied to its gate 209, and the unselected memory cells are memory cells 511, 512, 513, 514, 515, 516, and 517 having voltage Va or Vb applied to their gates 209. Voltage Vb is greater than each of voltages Va and Vsel. Voltage Va is greater than voltage Vsel. Applying voltages Vsel, Va, and Vb as shown in FIG. 5 during different read operations of memory device 500 can have characteristics similar to those of memory device 200 during a read operation, described above with reference to FIG. 2 and FIG. 3.

Figure 6:
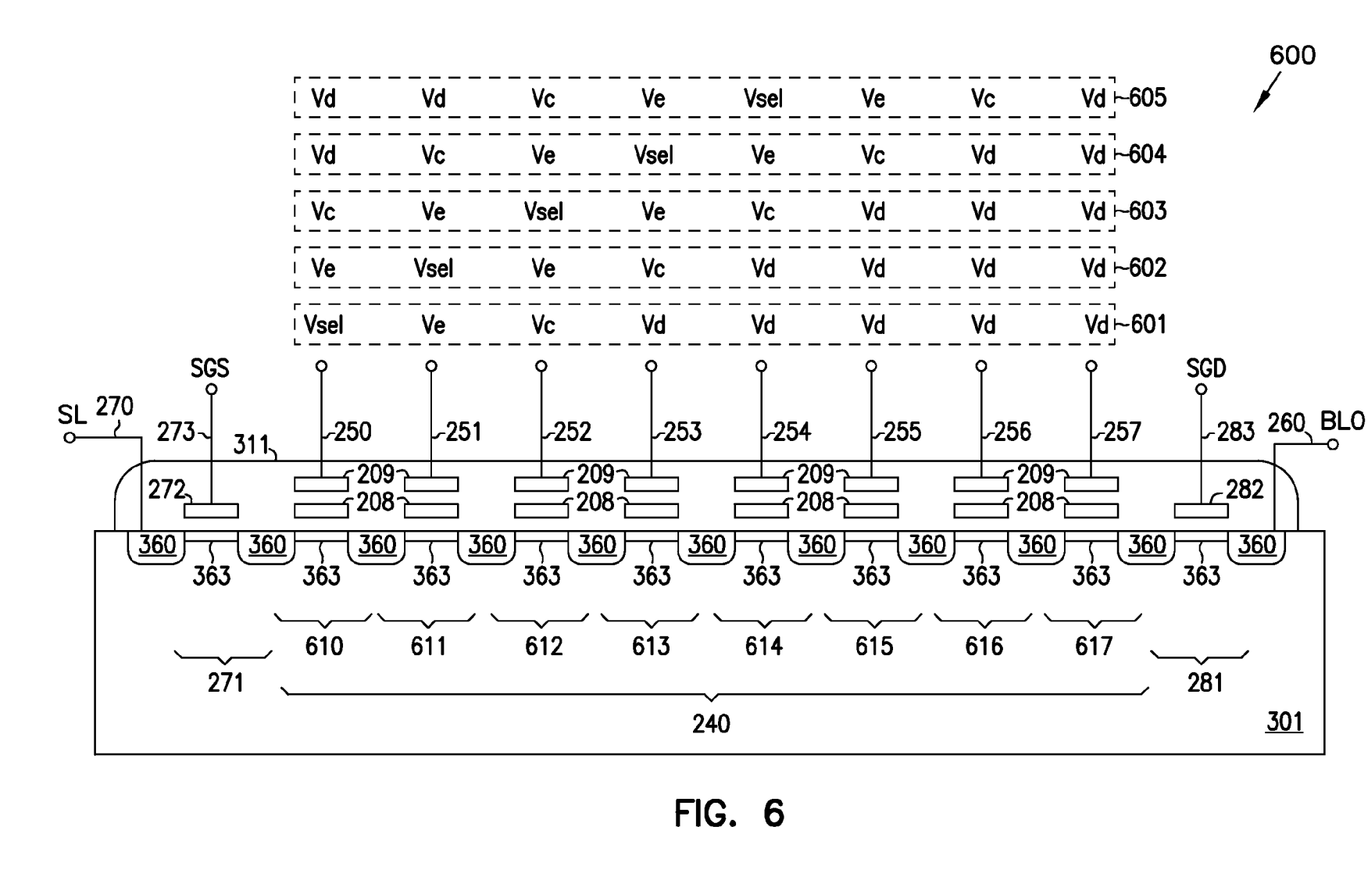
FIG. 6 shows a diagram of a portion of a memory device with four voltages applied to gates of different selected memory cells at different read operations, according to an example embodiment of the invention.

FIG. 6 shows a diagram of a portion of a memory device 600 with voltages Vsel, Vc, Vd, and Ve applied to gates of different selected memory cells at different read operations 601, 602, 603, 604, and 605, according to an example embodiment of the invention. Voltage Vsel, Vc, Vd, and Ve can respectively correspond to voltages V1, V4, V5, and V6 of FIG. 3. Memory device 600 includes components similar to those of memory device 200 of FIG. 2 and FIG. 3. Thus, for simplicity, description for the similar components between FIG. 3 and FIG. 6 (shown by the same designation numbers) is not repeated.

In FIG. 6, in each of read operations 601, 602, 603, 604, and 605, the selected memory cell is the memory cell having Vsel applied to its gate 209 (e.g., control gate). For example, in read operation 601, the selected memory cell is memory cell 610 having voltage Vsel applied to its gate 209, and the unselected memory cells are memory cells 611, 612, 613, 614, 615, 616, and 617 having voltages Vc, Vd, or Ve applied to their gates 209. Voltage Ve is greater than each of voltages Vc, Vd, and Vsel. Voltage Vd is greater than voltage Vc. Voltage Vc is greater than voltage Vsel. Applying voltages Vsel, Vc, Vd, and Ve as shown in FIG. 6 during different read operations of memory device 600 can have characteristics similar to those of memory device 200 and 400 during a read operation, described above with reference to FIG. 2, FIG. 3, and FIG. 4.

Figure 7:
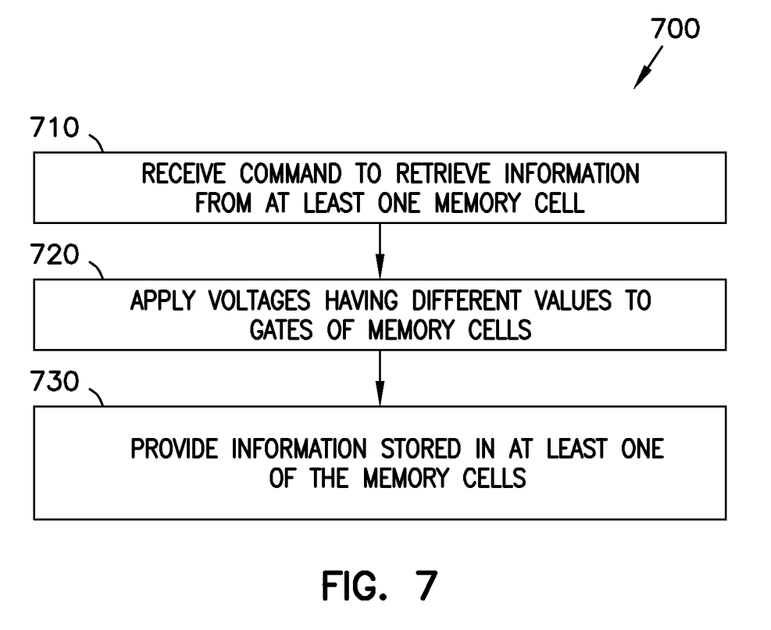
FIG. 7 is a flow chart showing a method, according to an example embodiment of the invention.

FIG. 7 is a flow chart showing a method 700 according to an example embodiment of the invention. Method 700 can be used in a memory device, such as memory device 100, 200, 400, 500, and 600 described above with reference to FIG. 1 through FIG. 6. In FIG. 7, activity 710 includes receiving a command to retrieve information from at least one memory cell of the memory device. The command can be provided from an additional device to lines of the memory device; the lines can be similar to lines 110 and 111 of memory device 100 of FIG. 1. The additional device can be a processor, a memory controller, or other devices. Activity 720 in FIG. 7 includes applying voltages to the gates (e.g., control gates) of memory cells of the memory device. The voltages can have at least three different values applied to the gates of different memory cells. Activity 730 includes providing information from at least one selected memory cell to lines of the memory device after information is retrieved from the selected memory cell. Activity 730 in FIG. 7 can includes providing the information to lines, similar to lines 110 of FIG. 1. Method 700 can include additional activities similar to those performed by memory device 100, 200, 400, 500, and 600 during a read operation described above with reference to FIG. 1 through FIG. 6.

One or more embodiments described herein include apparatus and methods having memory cells coupled in series and a module to cause application of voltages with at least three different values to gates of the memory cells during an operation to retrieve information stored in at least one of the memory cells. Other embodiments, including additional apparatus and methods described above with reference to FIG. 1 through FIG. 7.

The illustrations of apparatus such as memory devices 100 and 200 are intended to provide a general understanding of the structure of various embodiments and not a complete description of all the elements and features of the apparatus that might make use of the structures described herein.

Any of the components described above with reference to FIG. 1 through FIG. 7 can be implemented in a number of ways, including simulation via software. Thus, apparatus (e.g., memory devices 100, 200, 400, 500, and 600 including their associated circuit components) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory devices 100, 200, 400, 500, and 600) or as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multi-chip modules. Such apparatus may further be included as sub-components within a variety of electronic systems, such as televisions, memory cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Portions and features of some embodiments may be included in, or substituted for, those of others.

Other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising:
a first memory cell including a first gate, a second memory cell including a second gate, and a third memory cell including a third gate, the third memory cell being coupled between the first and second memory cells; and
a module configured to cause an application of a first voltage having a first value to the first gate during an operation to retrieve information stored in the first memory cell, a second voltage having a second value to the second gate during the operation, and a third voltage having a third value to the third gate during the operation, wherein the third value is greater than the second value, and the second value is greater than the first value.

2. The apparatus of claim 1, further comprising:
a fourth memory cell coupled in series with the first, second, and third memory cells, the fourth memory cell including a fourth gate, wherein the module is further configured to cause an application of a fourth voltage having a fourth value to the fourth gate during the operation, and wherein the fourth value is equal to the second value.

3. The apparatus of claim 1, further comprising:
a fourth memory cell coupled to the first memory cell, such that the first memory cell is between the third and fourth memory cells, wherein the module is configured to cause an application of a fourth voltage having a fourth value to a gate of the fourth memory cell, wherein the fourth value is equal to the third value.

4. The apparatus of claim 1, wherein the first value includes a reference voltage.

5. An apparatus comprising:
memory cells coupled in a series, each of the memory cells including a gate, the gates being electrically isolated from each other; and
a module configured to cause an application of voltages including three different values to gates of a selected memory cell, a first memory cell, and a second memory cell among the memory cells during an operation to retrieve information stored in the selected memory cell, wherein the first and second memory cells are located on one side of the selected memory cell, and wherein the first memory is located between the selected memory cell and the second memory cell, and wherein the module is configured to cause the application of the voltages, such that a value of a voltage applied to the gate of the first memory cell is greater than a value of voltage applied to the gate of the second memory cell.

6. The apparatus of claim 5, wherein the module is configured to cause the application of the voltages, such that a value of a voltage applied to the gate of the first memory cell is approximately ten percent greater than a value of a voltage applied to the gate of the second memory cell.

7. The apparatus of claim 5, further comprising:
lines coupled to the memory cells; and
a sense amplifier unit coupled to the lines to sense signals on at least one of the lines during the operation to determine information store in the selected memory cell.

8. An apparatus comprising:
memory cells coupled in a series, each of the memory cells including a gate, the gates being electrically isolated from each other; and
a module configured to cause an application of voltages including three different values to gates of a selected memory cell, a first memory cell, and a second memory cell among the memory cells during an operation to retrieve information stored in the selected memory cell, wherein the first and second memory cells are located on one side of the selected memory cell, the first memory cell is immediately adjacent a first side of the selected memory cell, and wherein the memory cells include a third memory cell immediately adjacent a second side of the selected memory cell, and wherein the module is configured to cause the application of the voltages, such that a voltage applied to the gate of each of the first and third memory cells is greater than a voltage applied to the gates of other memory cells in the series.

9. An apparatus comprising:
memory cells coupled in a series, each of the memory cells including a gate, the gates being electrically isolated from each other; and
a module configured to cause an application of voltages including three different values to gates of a selected memory cell, a first memory cell, and a second memory cell among the memory cells during an operation to retrieve information stored in the selected memory cell, wherein the first and second memory cells are located on one side of the selected memory cell, the first memory cell is immediately adjacent a first side of the selected memory cell, and wherein the memory cells include a third memory cell immediately adjacent a second side of the selected memory, and wherein the module is configured to cause the application of the voltages such that a value of a voltage applied to the gate of the third memory cell is equal to a value of a voltage applied to the gate of the first memory cell.

10. A method comprising:
receiving a command to read information stored in at least one of memory cells of a device during an operation of the device, the memory cells coupled in series, each of the memory cells including a gate, the gates of the memory cells being electrically isolated from each other; and
applying voltages having at least four different values to different gates during the operation.

11. The method of claim 10, further comprising:
during the operation, sensing signals on lines coupled to a selected memory cell among the memory cells to determine information stored in the selected memory cell.

12. The method of claim 11, wherein applying the voltages include:
applying a first voltage of the voltages to a first gate of a first memory cell of the memory cells; and
applying a second voltage of the voltages to a second gate of a second memory cell of the memory cells, wherein the first voltage has a value approximately ten percent greater than a value of the second voltage.

13. The method of claim 10, wherein the memory cells include a first memory cell immediately adjacent a first side of the selected memory cell and a second memory cell immediately adjacent a second side of the selected memory cell, and wherein applying the voltages includes applying a first voltage having a first value to the gate of the first memory cell, and applying a second voltage having a second value to the gate of the second memory cell, wherein the first value is equal to the second value.

14. A method comprising:
applying a first voltage having a first value to a first gate of a first memory cell of a device during a read operation of the device;
applying a second voltage having a second value to a second gate of a second memory cell of the device during the read operation, wherein the second value is greater than the first value; and
applying a third voltage having a third value to a third gate of a third memory cell of the device during the read operation, wherein the third value is greater than the second value, and the third memory cell is between the first and second memory cells.

15. The method of claim 14, further comprising:
applying a fourth voltage having a fourth value to a fourth gate of a fourth memory cell of the device during the read operation, the fourth memory cell coupled in series with the first, second, and third memory cells, wherein the fourth value is equal to the second value.

16. The method of claim 14, further comprising:
applying the first voltage to the third gate during an additional read operation of the device;
applying the third voltage to the second gate during the additional read operation; and
applying the third voltage to the first gate during the additional read operation.

17. The method of claim 16, further comprising:
applying the second voltage to a fourth gate of a fourth memory cell of the device during the additional read operation.

18. The method of claim 14, wherein the first value is equal to zero.

* * * * *

UNITED STATES PATENT AND TRADEMARK OFFICE
CERTIFICATE OF CORRECTION

PATENT NO. : 8,422,300 B2  
APPLICATION NO. : 13/219473  
DATED : April 16, 2013  
INVENTOR(S) : Paul D. Ruby Page 1 of 1

It is certified that error appears in the above-identified patent and that said Letters Patent is hereby corrected as shown below:

In the Claims:

In column 8, line 56, in Claim 5, delete "of" and insert -- of a --, therefor.

In column 8, line 67, in Claim 7, delete "store" and insert -- stored --, therefor.

In column 9, line 34, in Claim 9, delete "memory," and insert -- memory cell, --, therefor.

Signed and Sealed this  
Twenty-third Day of July, 2013

Teresa Stanek Rea  
*Acting Director of the United States Patent and Trademark Office*